(12) United States Patent
Su et al.

(10) Patent No.: US 12,376,207 B2
(45) Date of Patent: *Jul. 29, 2025

(54) LIGHTING APPARATUS

(71) Applicant: XIAMEN LEEDARSON LIGHTING CO., LTD, Fujian (CN)

(72) Inventors: Jingjing Su, Fujian (CN); Jiayuan Zhang, Fujian (CN); Wenhui Yang, Fujian (CN); Xiaoming Yang, Fujian (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,700

(22) Filed: May 8, 2023

(65) Prior Publication Data

US 2023/0276549 A1 Aug. 31, 2023

Related U.S. Application Data

(63) Continuation of application No. 16/997,935, filed on Aug. 20, 2020, now Pat. No. 11,683,868.

(30) Foreign Application Priority Data

Aug. 28, 2019 (CN) .......................... 201910802080.5

(51) Int. Cl.
*H05B 45/10* (2020.01)
*H05B 45/325* (2020.01)
(Continued)

(52) U.S. Cl.
CPC ........... *H05B 45/10* (2020.01); *H05B 45/325* (2020.01); *H10H 20/8514* (2025.01); *H10H 20/855* (2025.01)

(58) Field of Classification Search
CPC ...... H05B 45/10; H05B 45/325; H05B 45/20; H01L 33/505; H01L 33/58; H01L 33/504; H01L 25/0753; F21S 10/02; F21V 17/101; F21V 23/003; F21V 23/04; F21V 23/06; F21Y 2115/10
See application file for complete search history.

(56) References Cited

U.S. PATENT DOCUMENTS 11,683,868 B2 * 6/2023 Su .......................... H05B 45/10
315/294
2009/0278465 A1 * 11/2009 Farmer ................ H05B 45/345
363/126

(Continued)

FOREIGN PATENT DOCUMENTS

WO WO-2019126583 A1 * 6/2019 ............. H05B 45/20

*Primary Examiner* — Renan Luque
(74) *Attorney, Agent, or Firm* — LanWay IPR Services; Chun-Ming Shih

(57) ABSTRACT

A lighting apparatus includes a driver, a light source, and a controller. The driver is used for converting an external power to generate multiple driving currents. The light source includes a package holder integrating multiple LED modules having different output light parameters. The package holder has multiple terminals for separately receiving the driving currents to control the multiple LED modules independently in the package holder. The controller is used for controlling the driver for adjusting a relative ratio among the multiple driving currents to render an output light of the light source corresponding to predetermined optimized settings for at least an object illuminated by the light source.

16 Claims, 18 Drawing Sheets

(51) Int. Cl.
*H10H 20/851* (2025.01)
*H10H 20/855* (2025.01)

(56) References Cited

U.S. PATENT DOCUMENTS

| | | | | |
|---|---|---|---|---|
| 2014/0197431 | A1* | 7/2014 | Oka | H01L 33/50 |
| | | | | 257/88 |
| 2015/0230316 | A1* | 8/2015 | Baaijens | G09F 13/00 |
| | | | | 315/153 |
| 2016/0227629 | A1* | 8/2016 | Conner | H05B 47/18 |
| 2018/0069162 | A1* | 3/2018 | Abe | H01L 25/0753 |
| 2018/0351054 | A1* | 12/2018 | Chen | H01L 33/508 |
| 2019/0221726 | A1* | 7/2019 | Chen | H01L 33/505 |
| 2019/0326349 | A1* | 10/2019 | Kwon | H01L 33/0093 |

* cited by examiner

LIGHTING APPARATUS

RELATED APPLICATION

The present invention is a continuation application U.S. patent application Ser. No. 16/997,935.

FIELD

The present invention is related to a lighting apparatus, and more particularly related to a lighting apparatus optimized for illuminating different objects.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

For commercial or other environments, it is important to optimize the visual effect by adjusting the light parameter. It is usually difficult for users to adjust directly by choosing or selecting parameters of multiple light devices.

Furthermore, it is not convenient by mixing multiple light devices to render a desired optical effect.

Therefore, it is beneficial to design a lighting apparatus that may be conveniently and easily to be adjusted by users.

SUMMARY

In some embodiments, a lighting apparatus includes a driver, a light source, and a controller.

The driver is used for converting an external power to generate multiple driving currents. The light source includes a package holder integrating multiple LED modules having different output light parameters. For example, the LED modules have different color temperatures, colors, spectrum compositions and distributions.

The package holder has multiple terminals for separately receiving the driving currents to control the multiple LED modules independently in the package holder.

The controller is used for controlling the driver for adjusting a relative ratio among the multiple driving currents to render an output light of the light source corresponding to predetermined optimized settings for at least an object illuminated by the light source.

The driver and the controller may be integrated as an integrated chip or produced as multiple circuit components electrically connected. The driver and the controller may be integrated on the package holder or placed as separate modules.

In some embodiments, the package holder is a substrate plate, the multiple LED modules are mounted on the substrate plate directly. In some embodiments, the LED modules are placed in a package structures with plastic housing and external electrodes. However, in some embodiments, a circuit board or a substrate plate is directly used as the package holder, e.g. COB (chip on board) LED devices, which LED chips are directly mounted on the substrate plate.

In some embodiments, the multiple driving currents generated by a PWM (Pulse Width Modulation) power circuit. The relative ratio of the multiple driving currents corresponds to a duty ratio corresponding to each driving current of the PWM power circuit. For example, when there are four LED modules, the PWM power circuit supplies driving currents to the four LED modules sequentially and alternatingly over time. For example, the first LED module receives the driving current for a first time period, then the second LED module receives the driving current for a second time period. The other two LED modules receive the driving currents under an ordered sequence, too. Then, the first LED module is supplied with the driving current again and the process is repeated again and again under very rapid speed.

The time period ratio determines the relative ratio mentioned above and consequently render an output light of a corresponding optical parameter.

In some embodiments, the multiple LED modules respectively comprise different fluorescent layers to render the different output light parameters.

In some embodiments, the multiple LED modules have the same type of LED chips.

The different output light parameters are achieved by disposing different fluorescent layers.

In some embodiments, the fluorescent layers are separated by a separating line. The separating line may be straight lines, saw lines, wave lines between two adjacent LED modules.

In some embodiments, the multiple fluorescent layers are arranged symmetrically with respect to a center point of the light source for more evenly rendering a mixed light.

In some embodiments, the lighting apparatus may also include a separating unit disposed between the multiple fluorescent layers.

There may be convex and/or concave micro-structures disposed on a surface of the separating unit for better attaching fluorescent material. It is particularly important when the LED modules are operated for a long time and the heat may loosen the attachment of the fluorescent material of the fluorescent layer.

In some embodiments, there are hooks for further enhancing the attachment. The separating unit may be made of transparent material.

In some embodiments, the separating unit has concave structure for firmly attaching the fluorescent layers.

In some embodiments, the multiple fluorescent layers are attached to a lens disposed above LED chips of the multiple LED modules.

In some embodiments, a surface of the multiple fluorescent layers forms a lens surface for changing light paths of the light source.

The lens surface may diffuse the light of the light source. For example, the lens surface helps diffusing the light of the light source evenly to a surface.

In some embodiments, the light of the light source is condensed as a light beam.

In some embodiments, the package holder has multiple different tilt surfaces respectively mounting the multiple LED modules for adjusting light output directions of the multiple LED modules.

In some embodiments, the lighting apparatus may also include a manual switch for selecting from multiple options corresponding to different optimized object illumination sets.

There are several ways for designing the manual switch for providing more convenient operations. For example, the manual switch may be a rotation button.

In some embodiments, the manual switch may include multiple option switches respectively corresponding to different objects, and each option switch is manually turned on for enhancing illumination effect for the corresponding object.

In some embodiments, the manual switch may include multiple option switches, each option switch corresponding to an object type. When multiple option switches are turned on, the controller determine an associated relative ratio mentioned above for providing an optimized light over the illuminated objects selected.

In some embodiments, the controller adjusts the relative ratio according to a time parameter provided by a time device.

For example, the controller may have a clock indicating whether it is morning, afternoon or evening. The clock may also indicate whether it is a week day or a weekend. Such time information may be associated with different settings of the controller for determining a best setting corresponding to different timing points.

This is particularly helpful and attractive in markets like Costco or supermarkets. People have different moods in different time and such characteristics may be used by market specialists to find optimized settings of the lighting. Such finding may be programmed to the controller for providing a best parameter for the market to optimize the sales of the market.

In some embodiments, the controller has multiple sets of customer parameters, when the controller receives a customer instruction from an external device. The controller changes the relative ratio according to one corresponding customer parameter associated to the customer instruction.

In some embodiments, the controller calculates the relative ratio according to stored parameters of the multiple LED modules when the same type of the lighting apparatus has multiple types of combination of the LED modules.

For example, a lot of lighting apparatuses of the same type of lighting apparatus may be manufactured by a factory. Even when the lighting apparatuses are classified as the same type of product, they may have different components from different suppliers. In such case, the components from different suppliers may have certain difference.

The parameters of different LED modules are detected and recorded. A table which records the parameters may be stored in a memory circuit working with the controller for determining and finding a corresponding adjustment for providing a similar final parameter for the same type of lighting apparatus.

This feature is important for big company to provide high consistence quality of products.

In some embodiments, the controller adjusts the relative ratio according to a detected environment light parameter. For example, a mobile phone or a tool for detecting light parameters of environment is used for generating an information that is sent to the controller and used for determining a final light output.

For example, the original optimized relative ratio among different LED modules is determined when no other light is used. If the environment has lot of red light, for example, the controller may decrease the red light component when mixing lights of the LED modules.

In some embodiments, the detected light parameter is transmitted from an external device.

In some embodiments, the package holder has multiple electrode pins as the multiple terminals to be plugged to a socket for separately receiving the multiple driving currents.

DETAILED DESCRIPTION

Figure 12:
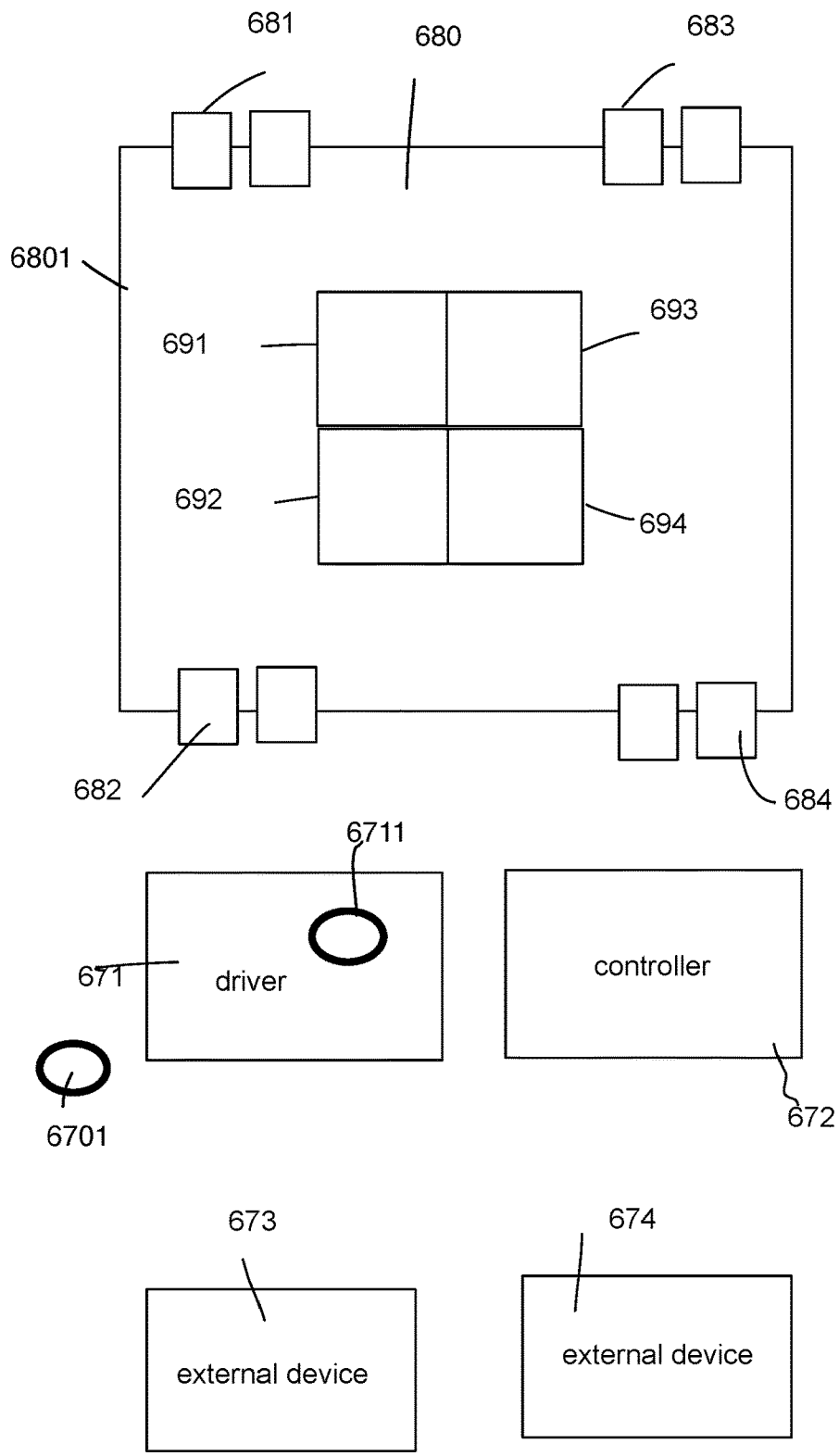
FIG. 12 shows an embodiment of a lighting apparatus.

In FIG. 12, a lighting apparatus includes a driver 671, a light source 680, and a controller 672.

The driver 671 is used for converting an external power 6701 to generate multiple driving currents. The light source includes a package holder 6801 integrating multiple LED modules 691, 692, 693, 694 having different output light parameters. For example, the LED modules have different color temperatures, colors, spectrum compositions and distributions.

The package holder 6801 has multiple terminals 681, 682, 683, 684 for separately receiving the driving currents to control the multiple LED modules 691, 692, 693, 694 independently in the package holder 6801.

The controller 672 is used for controlling the driver for adjusting a relative ratio among the multiple driving currents to render an output light of the light source 680 corresponding to predetermined optimized settings for at least an object illuminated by the light source 680.

For example, the objects may be a metal stuff, a clothing, a painting, fruit, meat or other objects. The same objects have different visual effect under lights of different parameters. Experts know how to find different sets of setting for optimizing looking of the objects in the store, in the library or at home.

What they need is a lighting device that may be configured conveniently. In such case, the lighting apparatus mentioned here may accept configuration in advance or adjust the setting dynamically by the controller.

The driver and the controller may be integrated as an integrated chip or produced as multiple circuit components electrically connected. The driver and the controller may be integrated on the package holder or placed as separate modules.

In some embodiments, the package holder is a substrate plate, the multiple LED modules are mounted on the substrate plate directly. In some embodiments, the LED modules are placed in a package structures with plastic housing and external electrodes. However, in some embodiments, a circuit board or a substrate plate is directly used as the package holder, e.g. COB (chip on board) LED devices, which LED chips are directly mounted on the substrate plate.

In FIG. 12, the multiple driving currents generated by a PWM (Pulse Width Modulation) power circuit 6711. The relative ratio of the multiple driving currents corresponds to a duty ratio corresponding to each driving current of the PWM power circuit. For example, when there are four LED modules, the PWM power circuit supplies driving currents to the four LED modules sequentially and alternatingly over time. For example, the first LED module receives the driving current for a first time period, then the second LED module receives the driving current for a second time period. The other two LED modules receive the driving currents under an ordered sequence, too. Then, the first LED module is supplied with the driving current again and the process is repeated again and again under very rapid speed.

The time period ratio determines the relative ratio mentioned above and consequently render an output light of a corresponding optical parameter.

In some embodiments, the multiple LED modules respectively include different fluorescent layers to render the different output light parameters.

Figure 17:
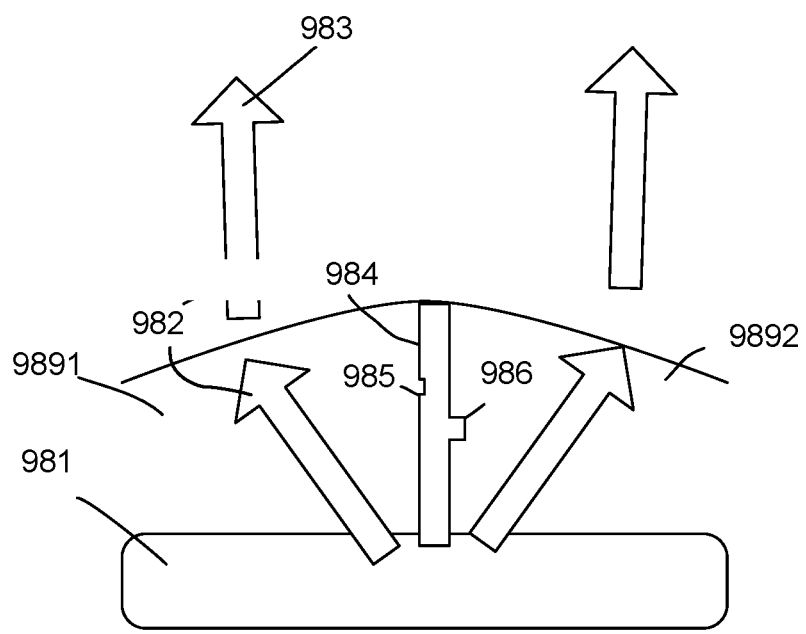
FIG. 17 shows a lens surface of the fluorescent layer.

For example, in FIG. 17, two fluorescent layers 9891, 9892 cover the same type of LED chip 981 forming two LED modules providing different optical parameters.

In some embodiments, the multiple LED modules have the same type of LED chips.

The different output light parameters are achieved by disposing different fluorescent layers.

In some embodiments, the fluorescent layers are separated by a separating line, as illustrated in FIG. 1 to FIG. 8. The separating line may be straight lines, saw lines, wave lines between two adjacent LED modules.

In some embodiments, the multiple fluorescent layers are arranged symmetrically with respect to a center point of the light source for more evenly rendering a mixed light. This may be clearly found examples in some patterns illustrated in FIG. 1 to FIG. 8.

In some embodiments, the lighting apparatus may also include a separating unit disposed between the multiple fluorescent layers.

Please refer to FIG. 17. A separating unit 984 with a convex structure 986 and a concave structure 985 for better attaching the fluorescent layer 9891, 9892.

There may be convex and/or concave micro-structures disposed on a surface of the separating unit for better attaching fluorescent material. It is particularly important when the LED modules are operated for a long time and the heat may loosen the attachment of the fluorescent material of the fluorescent layer.

In some embodiments, there are hooks for further enhancing the attachment. The separating unit may be made of transparent material.

In some embodiments, the separating unit has concave structure for firmly attaching the fluorescent layers.

In some embodiments, the multiple fluorescent layers are attached to a lens disposed above LED chips of the multiple LED modules.

Figure 19:
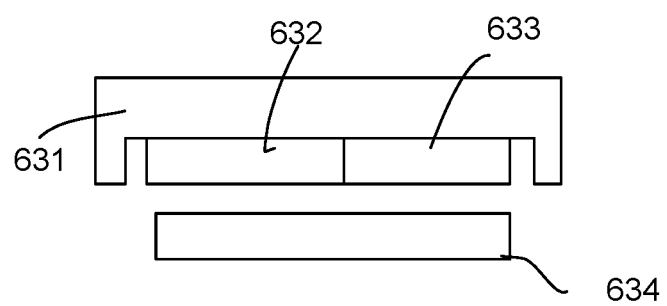
FIG. 19 shows another package example.

Please refer to FIG. 19. In FIG. 19, the fluorescent layers 632, 633 are attached to a lens 631 first and then the lens module is disposed above the LED chip 634. In such design, the fluorescent layer is attached to the lens as a module, which brings more convenient and flexible choice during mass production because more configurations may be made conveniently in advance while using the same LED chips or COB light sources.

In some embodiments, a surface of the multiple fluorescent layers forms a lens surface for changing light paths of the light source.

Figure 18:
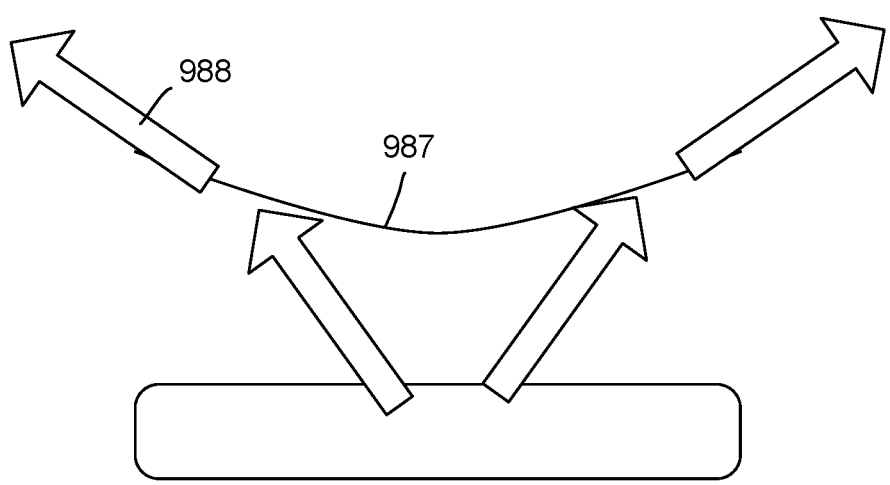
FIG. 18 shows another lens surface of the fluorescent layer.

Please refer to FIG. 17 and FIG. 18, which show two different ways of light path adjustment.

In FIG. 17, the top surface 987 of the fluorescent layer is formed as a condensing lens for changing a light path 982 to a light beam 983.

In FIG. 18, the top surface of the fluorescent layer is formed a diffusing lens for evenly diffusing the light to a diffused light 988 to a wider space to make the light more soft.

The lens surface may diffuse the light of the light source. For example, the lens surface helps diffusing the light of the light source evenly to a surface.

In some embodiments, the light of the light source is condensed as a light beam.

In some embodiments, the package holder has multiple different tilt surfaces respectively mounting the multiple LED modules for adjusting light output directions of the multiple LED modules.

Figure 13:
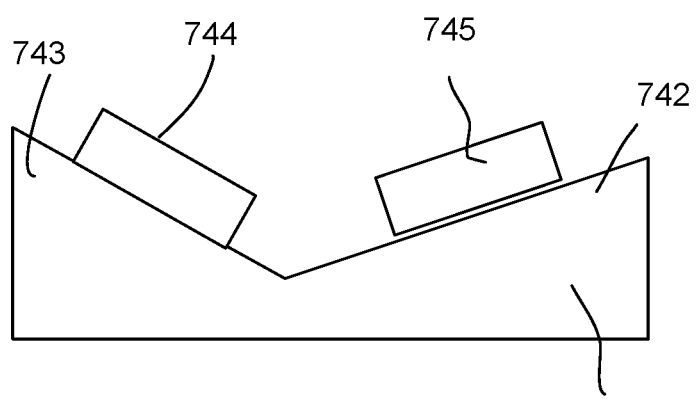
FIG. 13 shows a tilt arrangement of the package holder for different LED modules.

Please refer to FIG. 13. In FIG. 13, the package holder 741 has two tilt surfaces 743, 742 for respectively mounting two LED modules 744, 745 for adjusting output light directions to achieve a best mixed light effect.

In some embodiments, the lighting apparatus may also include a manual switch for selecting from multiple options corresponding to different optimized object illumination sets.

There are several ways for designing the manual switch for providing more convenient operations. For example, the manual switch may be a rotation button.

In some embodiments, the manual switch may include multiple option switches respectively corresponding to different objects, and each option switch is manually turned on for enhancing illumination effect for the corresponding object.

Figure 14:
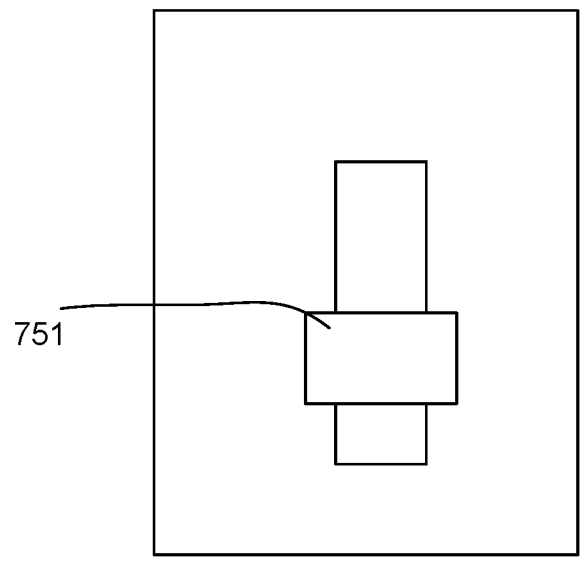
FIG. 14 shows a manual switch example.

FIG. 14 shows a sliding switch 751. The sliding positions may correspond to different settings of the controller to control the LED module operation.

Figure 15:
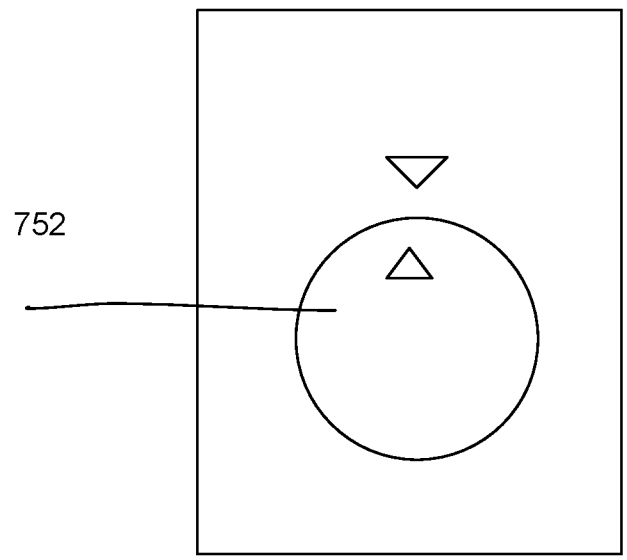
FIG. 15 shows another manual switch example.

FIG. 15 shows a rotating switch 752, which may be rotated to continuously configure a different setting while rotating.

In some embodiments, the manual switch may include multiple option switches, each option switch corresponding to an object type. When multiple option switches are turned on, the controller determine an associated relative ratio mentioned above for providing an optimized light over the illuminated objects selected.

Figure 16:
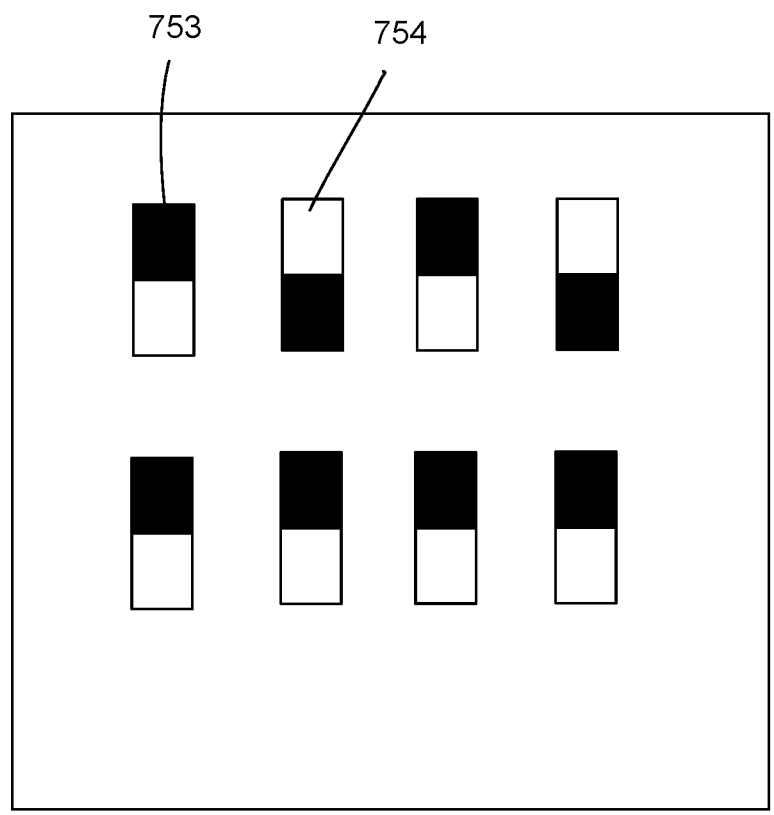
FIG. 16 shows another manual switch example.

FIG. 16 shows such an example. In FIG. 16, each option switch corresponds to an object type, e.g. fruit, clothing, meat. The option switch 753 is turned on while another option switch 754 is turned off to manually configure the controller mentioned above.

In some embodiments, the controller adjusts the relative ratio according to a time parameter provided by a time device.

For example, the controller may have a clock indicating whether it is morning, afternoon or evening. The clock may also indicate whether it is a week day or a weekend. Such time information may be associated with different settings of the controller for determining a best setting corresponding to different timing points.

This is particularly helpful and attractive in markets like Costco or supermarkets. People have different moods in different time and such characteristics may be used by market specialists to find optimized settings of the lighting. Such finding may be programmed to the controller for providing a best parameter for the market to optimize the sales of the market.

In some embodiments, the controller has multiple sets of customer parameters, when the controller receives a customer instruction from an external device. The controller changes the relative ratio according to one corresponding customer parameter associated to the customer instruction. For example, the external device 674 in FIG. 12 may be a server used in a market.

The server sends a marketing information to increase sales value. The marketing information is packaged as a customer instruction, e.g. more warm light needed now. The controller receives such customer instruction and translates the customer instruction into associated control signals for controlling the LED modules.

The external device 673 may be a light detector for detecting environment light parameter providing information to the controller to adjust the output of the lighting apparatus.

In some embodiments, the controller calculates the relative ratio according to stored parameters of the multiple LED modules when the same type of the lighting apparatus has multiple types of combination of the LED modules.

For example, a lot of lighting apparatuses of the same type of lighting apparatus may be manufactured by a factory. Even when the lighting apparatuses are classified as the same type of product, they may have different components from different suppliers. In such case, the components from different suppliers may have certain difference.

The parameters of different LED modules are detected and recorded. A table which records the parameters may be stored in a memory circuit working with the controller for determining and finding a corresponding adjustment for providing a similar final parameter for the same type of lighting apparatus.

This feature is important for big company to provide high consistence quality of products.

In some embodiments, the controller adjusts the relative ratio according to a detected environment light parameter. For example, a mobile phone or a tool for detecting light parameters of environment is used for generating an information that is sent to the controller and used for determining a final light output.

For example, the original optimized relative ratio among different LED modules is determined when no other light is used. If the environment has lot of red light, for example, the controller may decrease the red light component when mixing lights of the LED modules.

In some embodiments, the detected light parameter is transmitted from an external device.

In some embodiments, the package holder has multiple electrode pins as the multiple terminals to be plugged to a socket for separately receiving the multiple driving currents.

Figure 11:
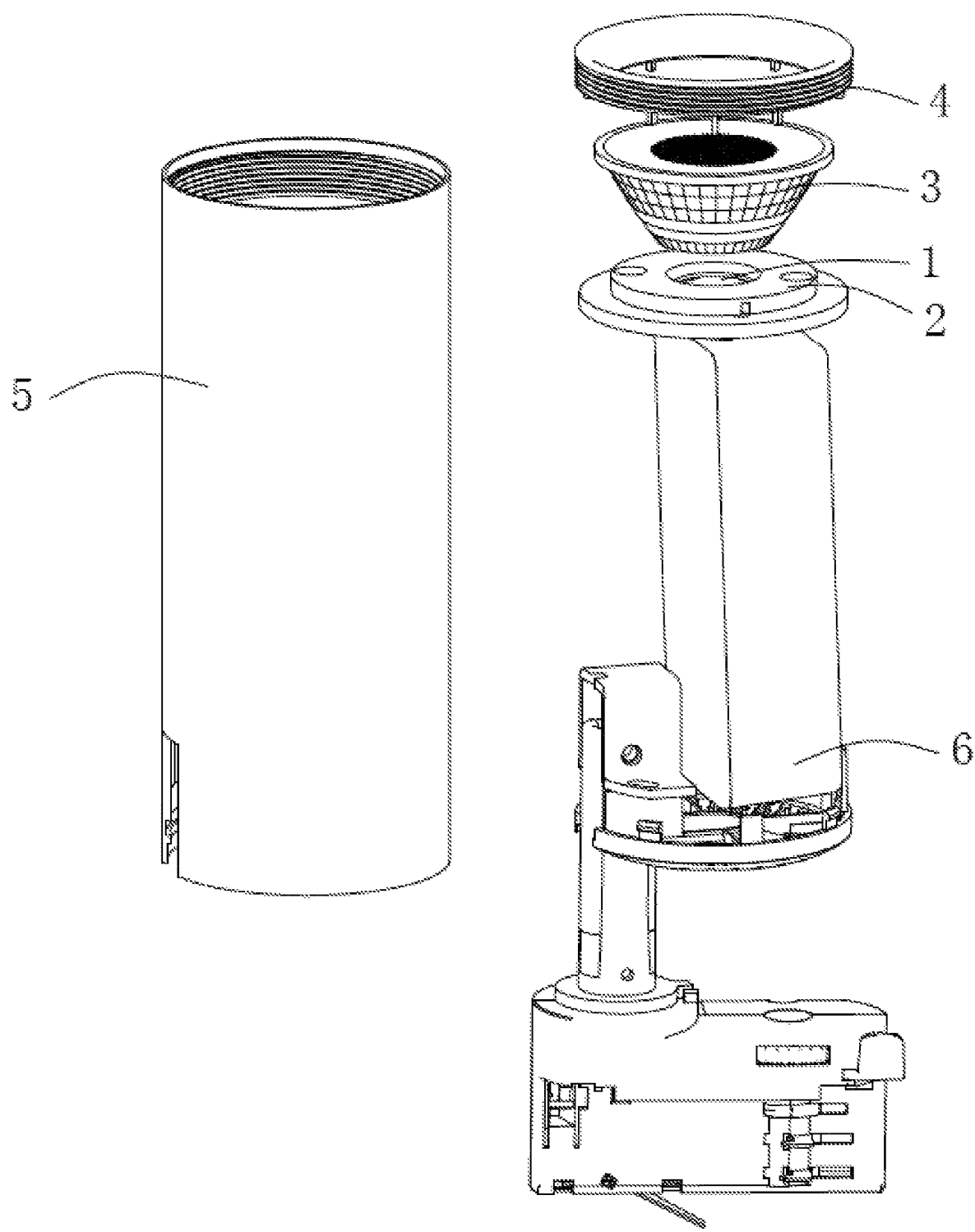
FIG. 11 illustrates a lighting apparatus for providing mixing effect for different objects.

Please refer to FIG. 11. In FIG. 11, a lighting device has a lens 3, a cover 4, LED modules mounted on a package holder 2. There is a housing 6 for storing a driver and a controller. A housing 5 is used for covering the components. Such lighting apparatus may be integrated with the designs mentioned above. Other lighting devices like light bulbs, spot lights, panel lights, downlight devices may also be integrated with the designs mentioned above.

Figure 9:
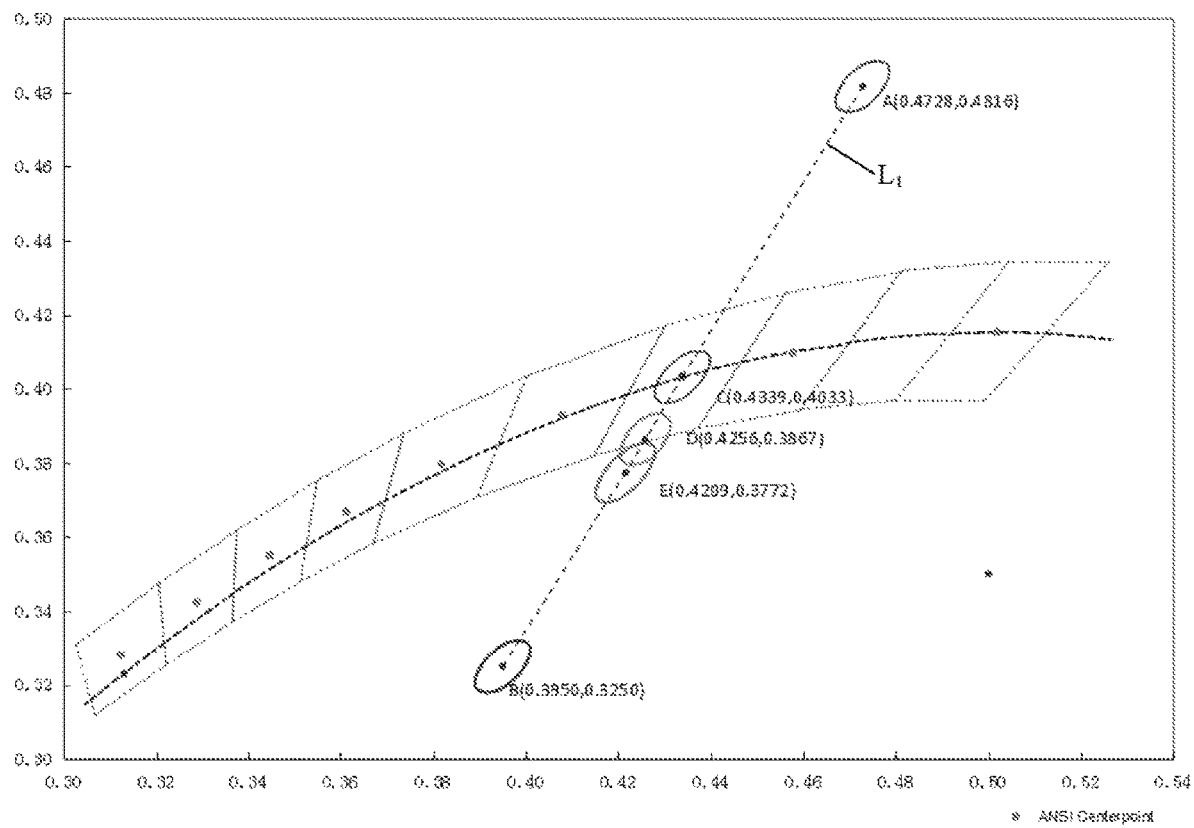
FIG. 9 illustrates shows a color space coordinate diagram.
Figure 10:
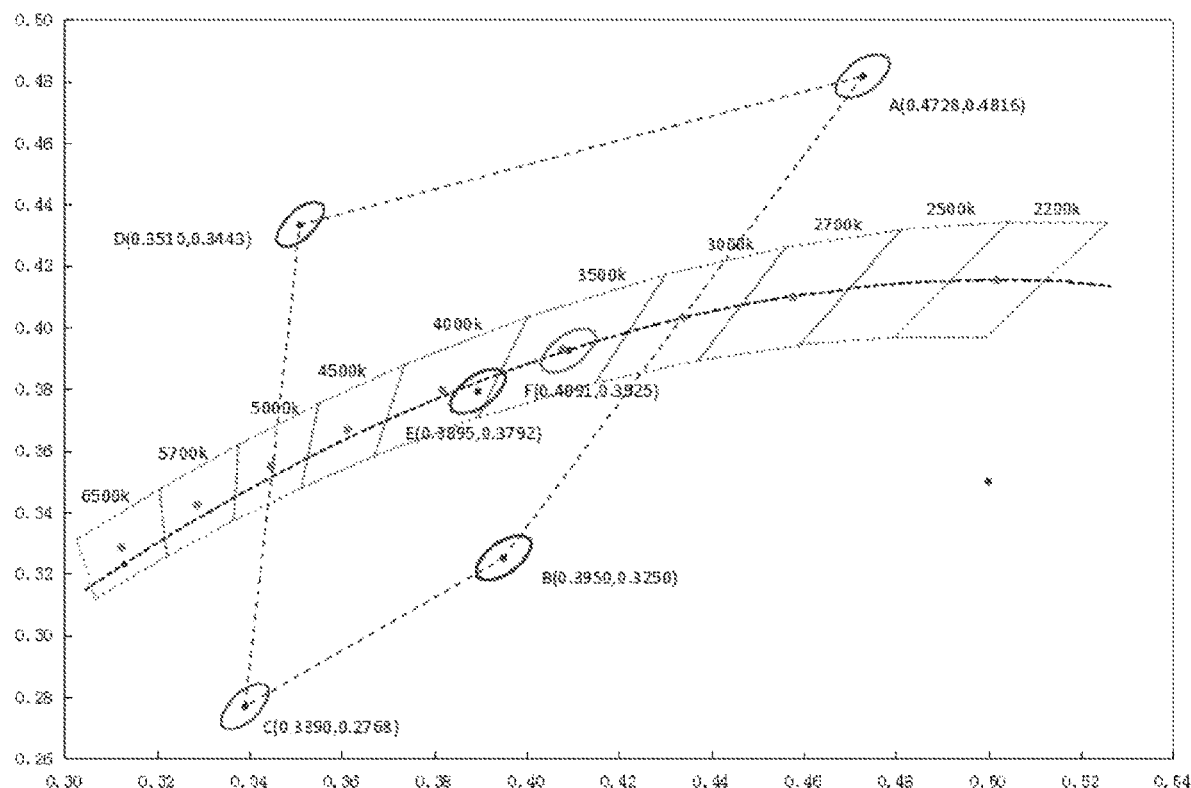
FIG. 10 illustrates shows how to mix a desired color coordinate by using more than three color coordinates.

FIG. 9 and FIG. 10 show two color space coordinate diagrams, showing how to mix lights from different LED modules.

Each LED module emits a light with a major color coordinate on the color diagram. In FIG. 9, several mixed coordinates are generated by mixing lights of two LED modules.

In FIG. 10, four LED modules are used forming a polygonal range, within which the controller mentioned above may adjust current ratio of the four LED modules to generate a final mixed coordinate falling within the polygonal range illustrated in FIG. 10.

In FIG. 1 to FIG. 8, different light source examples are illustrated. The light source 1 has a package holder 11, which is as a form of a substrate plate 11. There are electrodes 13 disposed for separately receiving driving currents.

Figure 1:
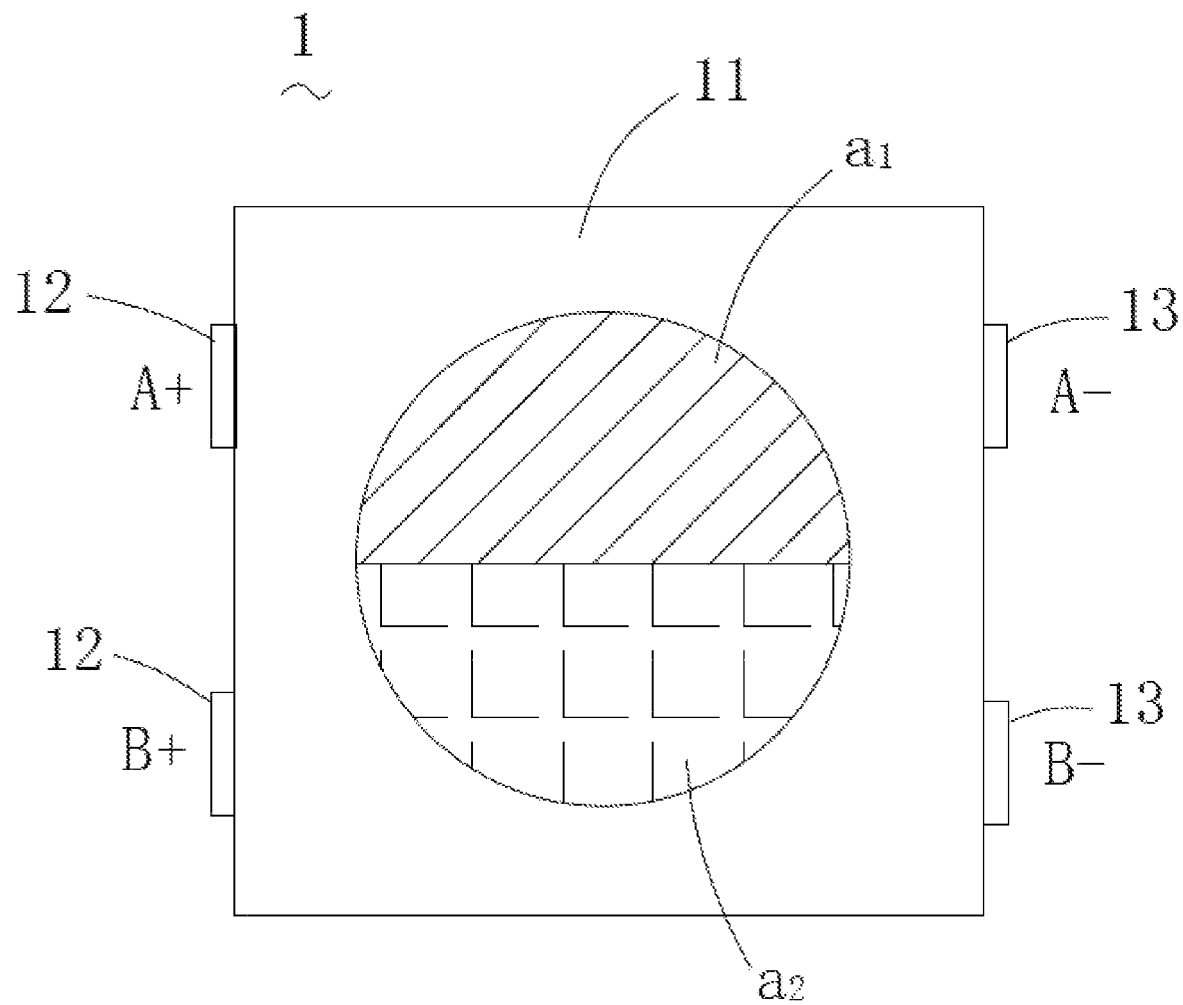
FIG. 1 illustrates a diagram of a light source example with multiple LED modules.
Figure 2:
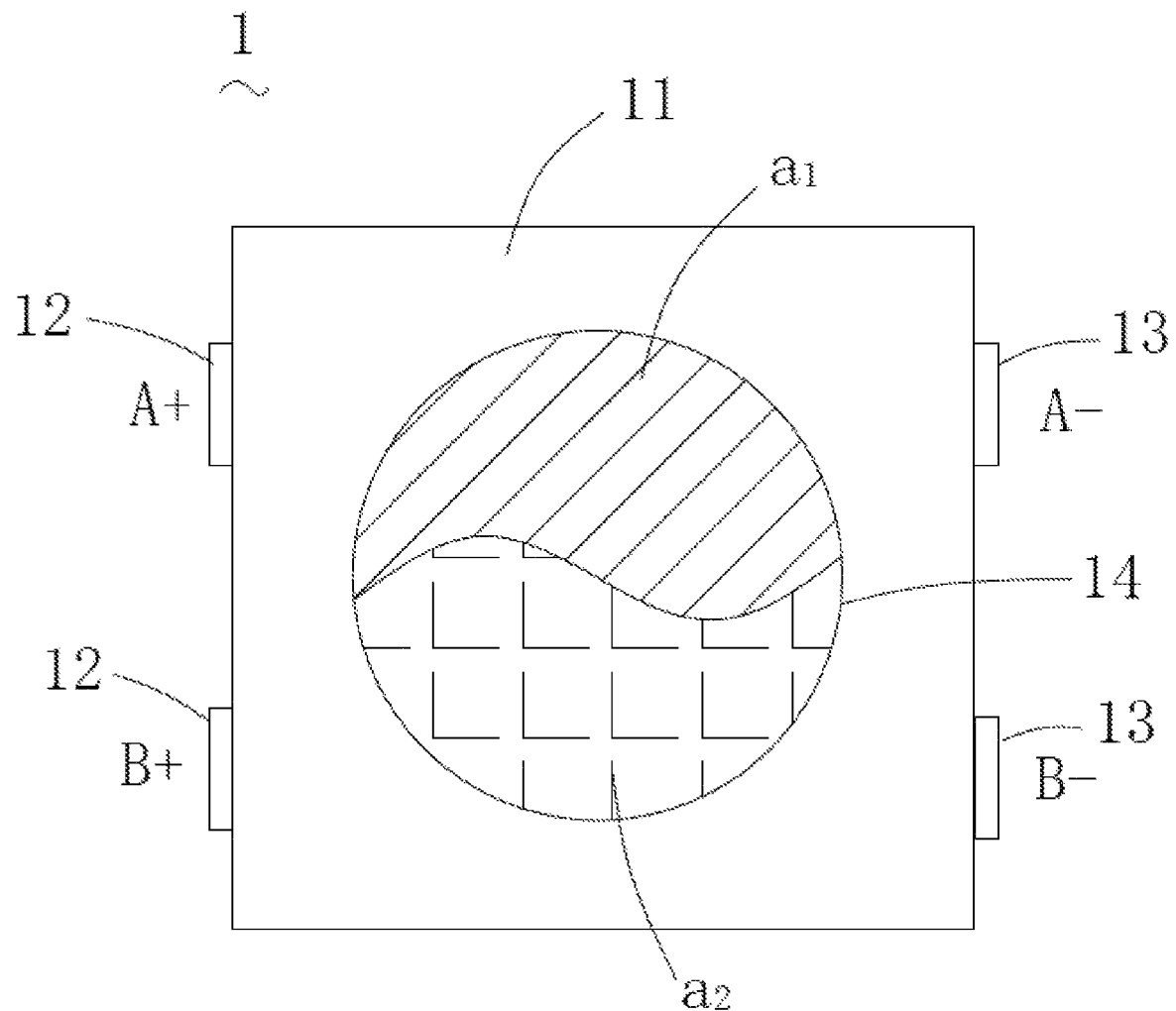
FIG. 2 illustrates another pattern for arranging multiple LED modules.

In FIG. 1 and FIG. 2, two fluorescent layers a1, a2 form a pattern of two LED modules 14.

Figure 3:
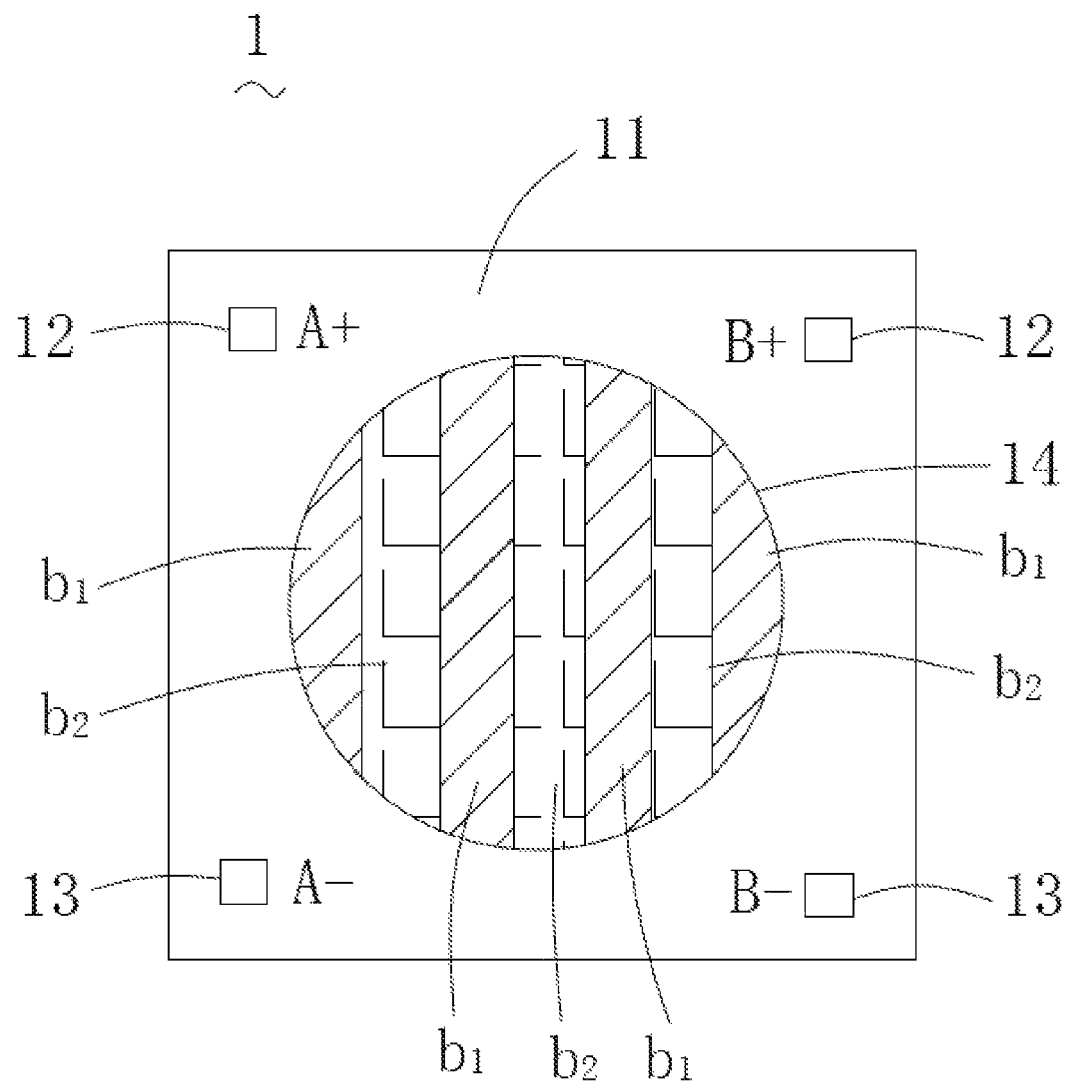
FIG. 3 illustrates another pattern for arranging multiple LED modules.
Figure 4:
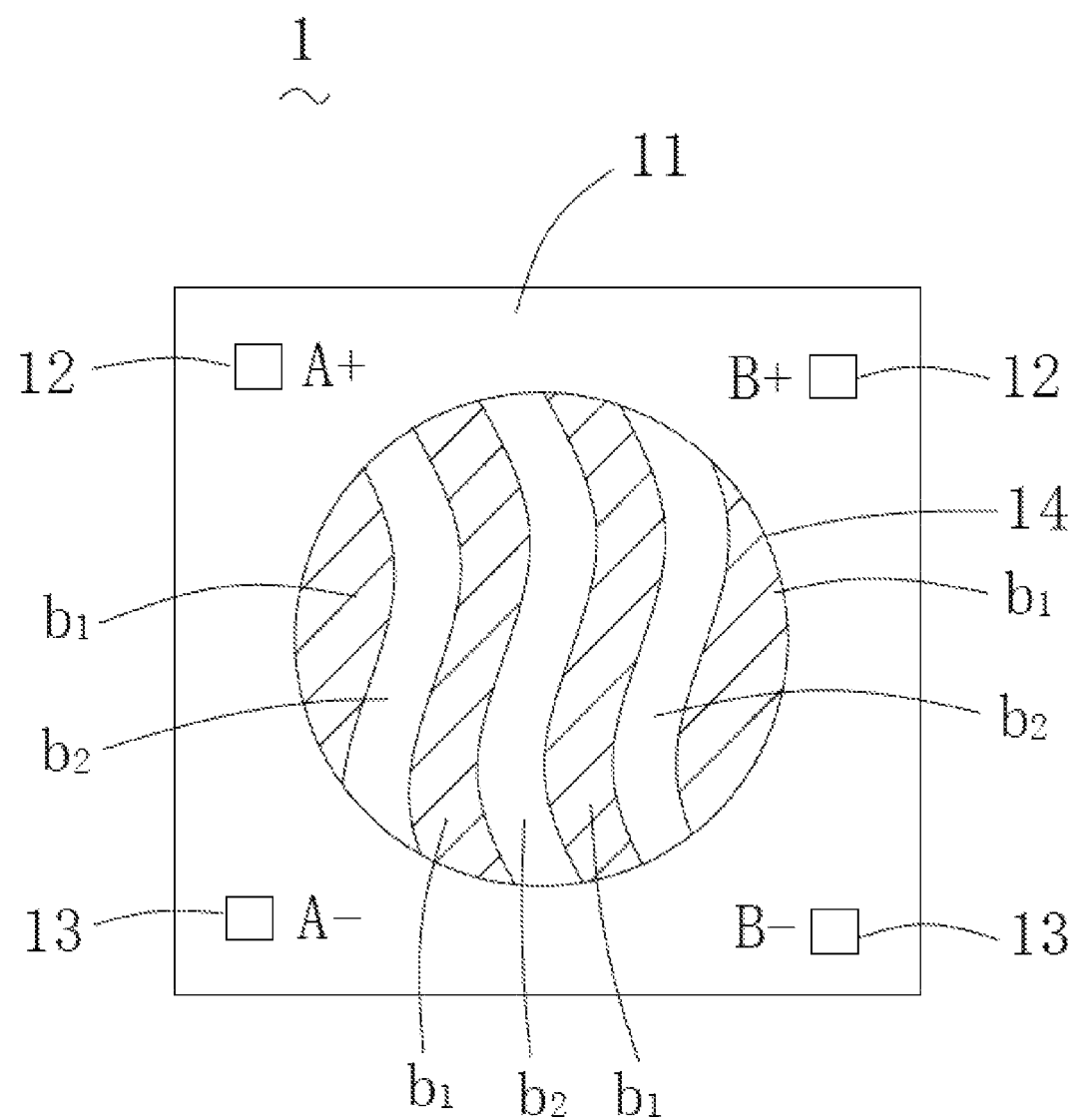
FIG. 4 illustrates another pattern for arranging multiple LED modules.

In FIG. 3 and FIG. 4, two fluorescent areas b1, b2 are arranged alternatively to provide better mixing effect.

Figure 5:
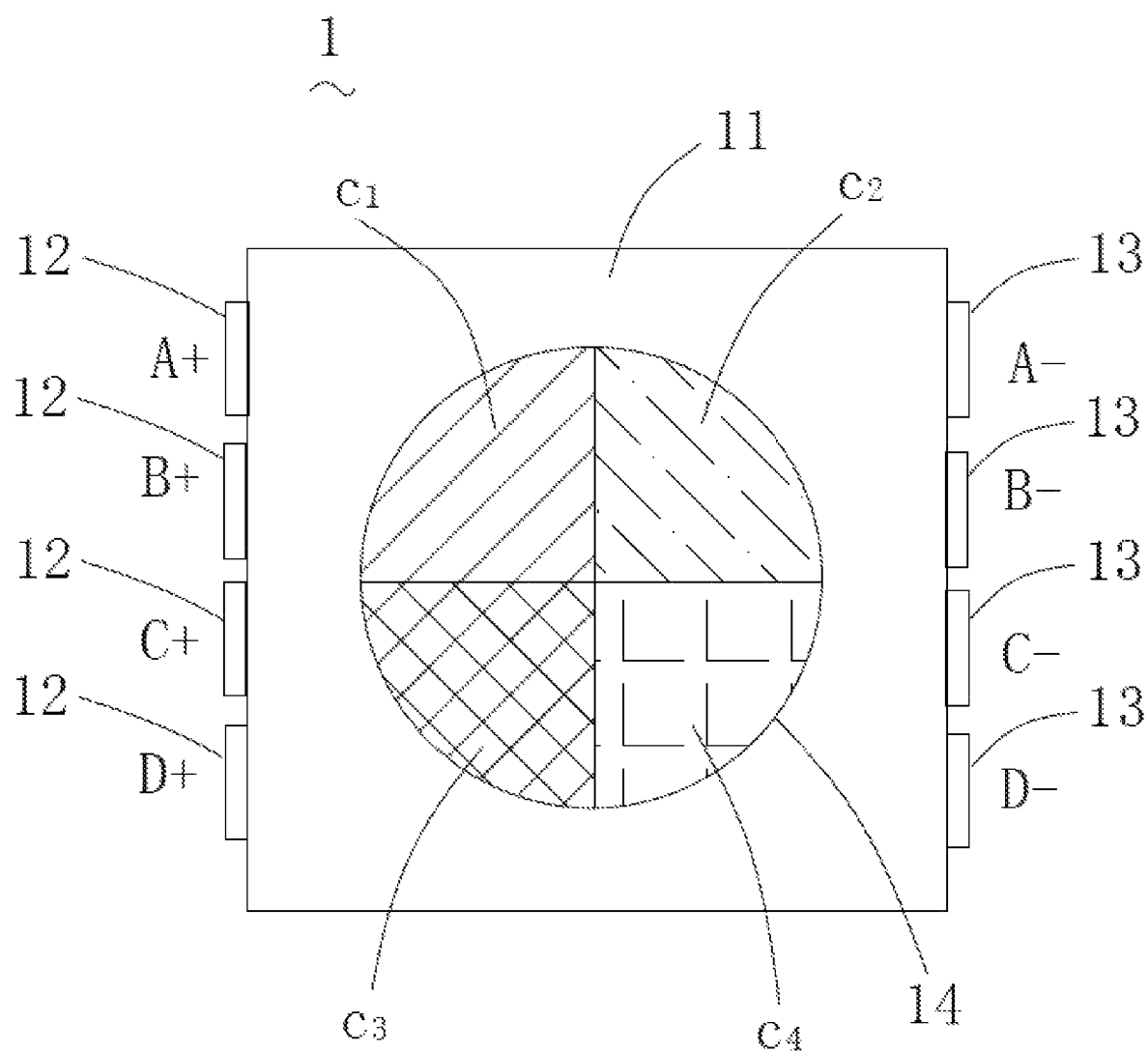
FIG. 5 illustrates another pattern for arranging multiple LED modules.
Figure 6:
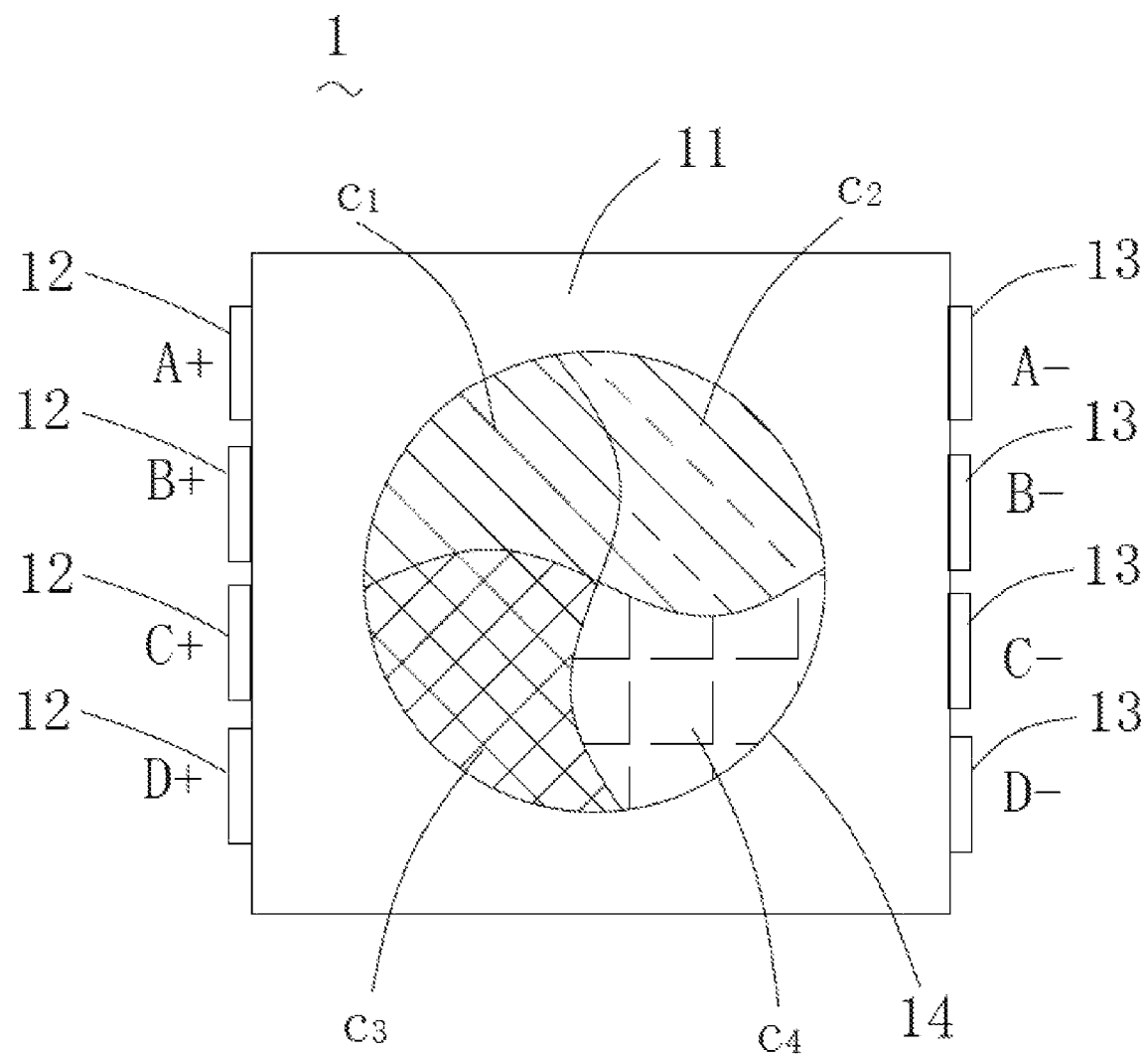
FIG. 6 illustrates another pattern for arranging multiple LED patterns.

In FIG. 5, FIG. 6, four fluorescent areas c1, c2, c3, c4 are formed symmetrically with respect to a middle center of the light source.

Figure 7:
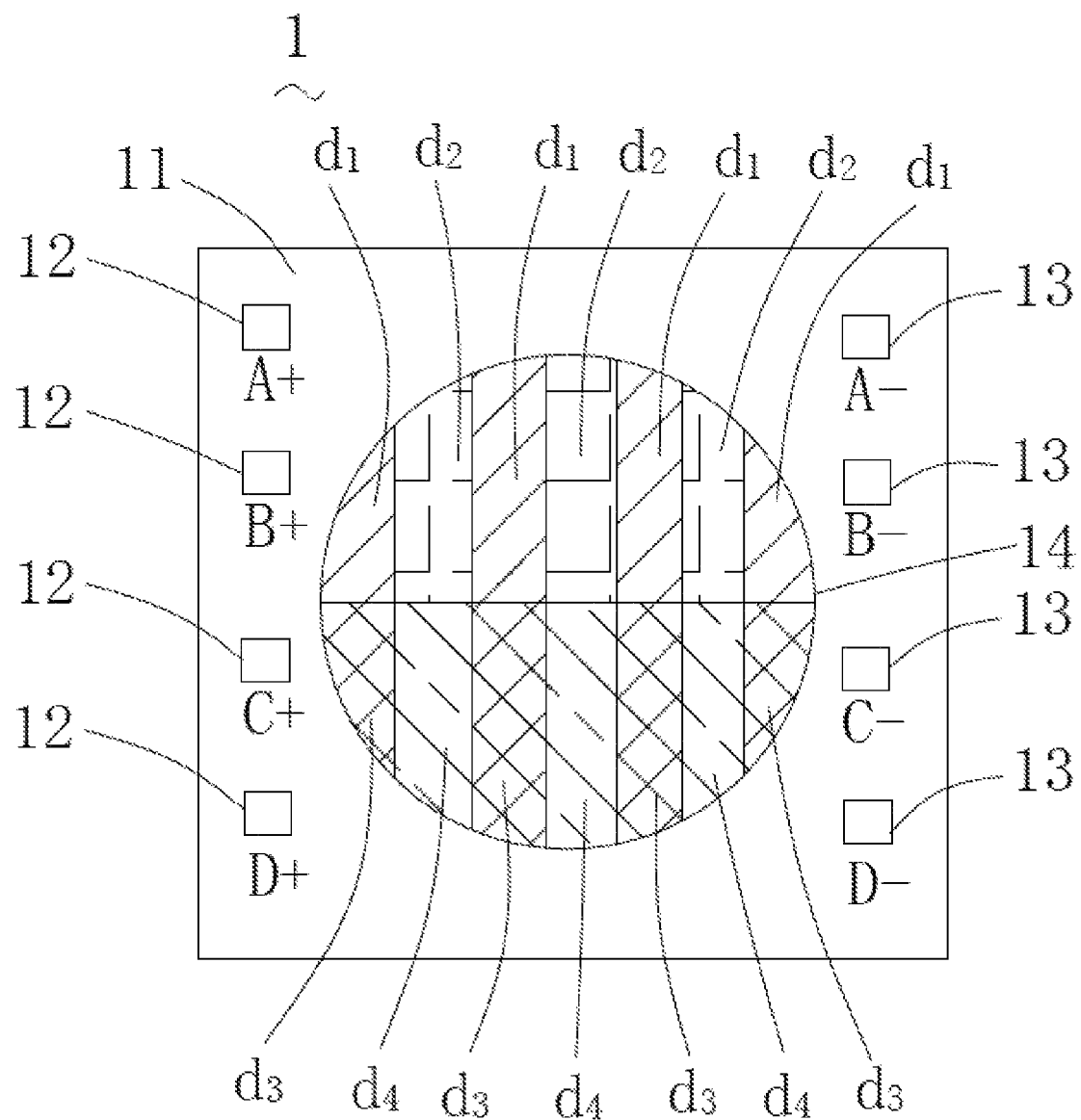
FIG. 7 illustrates another pattern for arranging multiple LED patterns.
Figure 8:
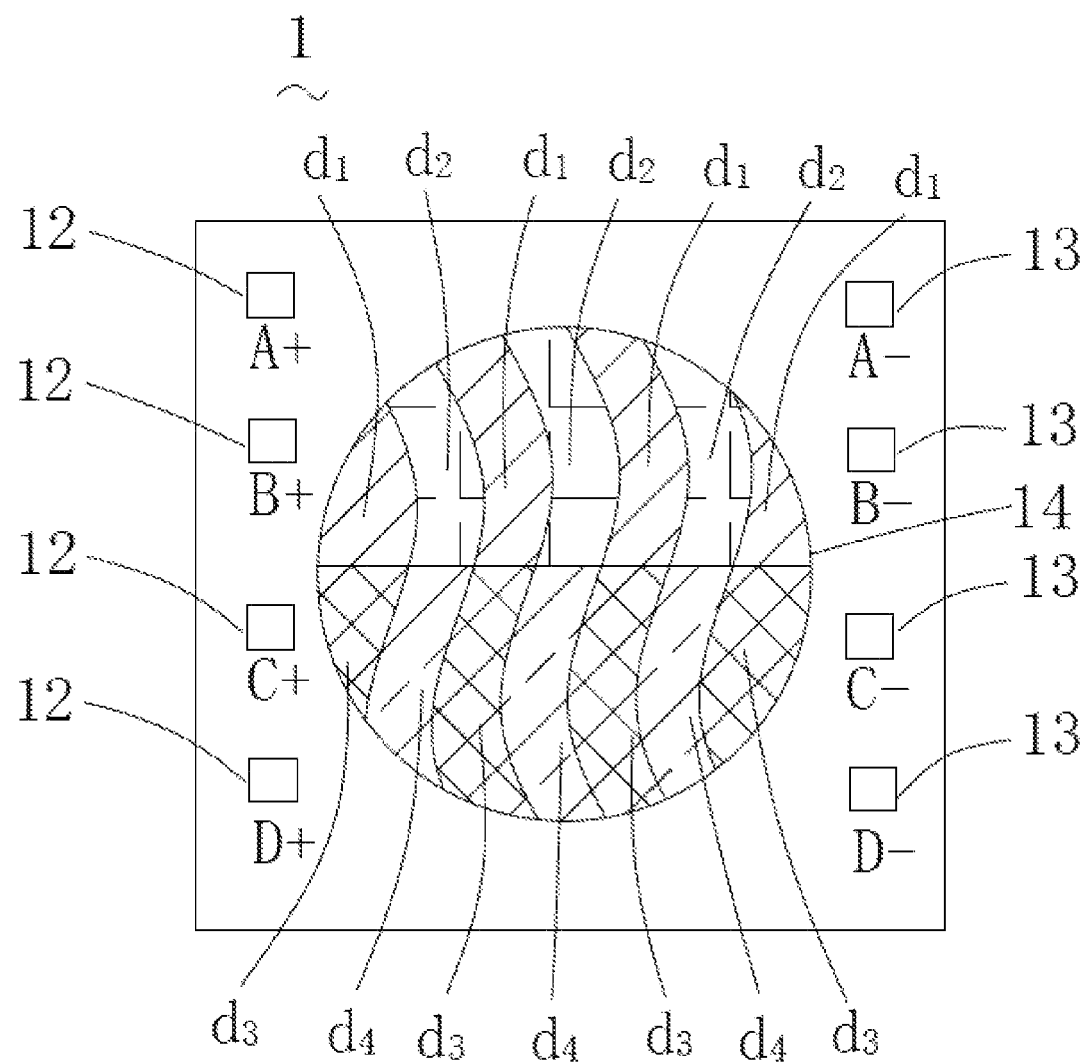
FIG. 8 illustrates another pattern for arranging multiple LED patterns.

In FIG. 7 and FIG. 8, four fluorescent areas d1, d2, d3, d4 are arranged with different patterns for providing different mixed effects.

The same reference numerals refer to the same components and are not repeated for brevity.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
   a driver for converting an external power to generate multiple driving currents;
   a light source comprising a package holder integrating multiple LED modules having different output light parameters, the package holder having multiple terminals for separately receiving the driving currents to control the multiple LED modules independently in the package holder, wherein the package holder has a plastic housing for disposing the terminals, for holding the multiple LED modules and for filling a fluorescent layer covering the multiple LED modules;
   a manual switch for selecting from the multiple options corresponding to different optimized object illumination sets; and
   a controller for controlling the driver for adjusting a relative ratio among the multiple driving currents to render an output light of the light source corresponding to predetermined optimized settings for at least an object illuminated by the light source, wherein the multiple LED modules respectively comprise different fluorescent layers to render the different output light parameters, wherein a surface of the multiple fluorescent layers forms a convex lens surface for changing light paths of the light source to a condensed light beam, wherein the controller provides the multiple options to be selected, wherein the multiple options are corresponding to the different optimized object illumination sets tailored for respectively rendering best visual effect of different object type being illuminated by the multiple LED modules, wherein the object types comprise one of metal, clothing, painting, fruit and meat.

2. The lighting apparatus of claim 1, wherein the package holder is a substrate plate, the multiple LED modules are mounted on the substrate plate directly.

3. The lighting apparatus of claim 1, wherein the multiple driving currents generated by a PWM (Pulse Width Modulation) power circuit, and the relative ratio of the multiple driving currents correspond to a duty ratio corresponding to each driving current of the PWM power circuit.

4. The lighting apparatus of claim 1, wherein the multiple LED modules have the same type of LED chips.

5. The lighting apparatus of claim 1, wherein the fluorescent layers are separated by a separating line.

6. The lighting apparatus of claim 1, wherein the multiple fluorescent layers are arranged symmetrically with respect to a center point of the light source.

7. The lighting apparatus of claim 1, further comprising a separating unit disposed between the multiple fluorescent layers.

8. The lighting apparatus of claim 7, wherein the separating unit has concave structure for firmly attaching the fluorescent layers.

9. The lighting apparatus of claim 1, wherein the package holder has multiple different tilt surfaces respectively mounting the multiple LED modules for adjusting light output directions of the multiple LED modules.

10. The lighting apparatus of claim 1, wherein the manual switch comprises multiple option switches respectively corresponding to different objects, and each option switch is manually turned on for enhancing illumination effect for the corresponding object.

11. The lighting apparatus of claim 1, wherein the controller adjusts the relative ratio according to a time parameter provided by a time device.

12. The lighting apparatus of claim 1, wherein the controller has multiple sets of customer parameters, when the controller receives a customer instruction from an external device, the controller changes the relative ratio according to one corresponding customer parameter associated to the customer instruction.

13. The lighting apparatus of claim 1, wherein the controller calculates the relative ratio according to stored parameters of the multiple LED modules when the same type of the lighting apparatus has multiple types of combination of the LED modules.

14. The lighting apparatus of claim 1, wherein the controller adjusts the relative ratio according to a detected environment light parameter.

15. The lighting apparatus of claim 14, wherein the detected light parameter is transmitted from an external device.

16. The lighting apparatus of claim 1, wherein the package holder has multiple electrode pins as the multiple terminals to be plugged to a socket for separately receiving the multiple driving currents.

* * * * *